Oct. 24, 1967 K. W. ADAMSON 3,348,557

APPARATUS FOR ETCHING METAL

Filed July 1, 1965 2 Sheets-Sheet 1

INVENTOR.
KENNETH W. ADAMSON
BY E. L. Brevik
ATTORNEY

Oct. 24, 1967 K. W. ADAMSON 3,348,557

APPARATUS FOR ETCHING METAL

Filed July 1, 1965 2 Sheets-Sheet 2

INVENTOR.
KENNETH W. ADAMSON
BY E. L. Brevik
ATTORNEY

United States Patent Office 3,348,557

Patented Oct. 24, 1967

3,348,557

APPARATUS FOR ETCHING METAL

Kenneth W. Adamson, 23346 Hartland St., Canoga Park, Calif. 91304

Filed July 1, 1965, Ser. No. 469,000
2 Claims. (Cl. 134—113)

ABSTRACT OF THE DISCLOSURE

This invention is a spray etching apparatus particularly unique for use in the field of printed circuitry and the photo-litographic arts. The apparatus consists of a horizontally mounted, rotating fixture for holding the work piece which is etched very uniformly from either one or both sides due to the distribution of the spray—combined with the action of gravity in the apparatus as described.

This invention pertains to a new and novel apparatus and process for the etching of metallic parts and more particularly for the chemical etching of printed circuits and photogravure printing plates and the like.

The rapid growth of the electronics industry in the recent past has been largely a result of what has become known in the trade as printed circuitry. The development and application of the printed circuit has been made possible through improved techniques in the art of image application and advances in the techniques of metal etching; it is, generally, this latter phase in which my invention finds application. However, as my apparatus and process will find application in the related fields of chemical milling and the manufacture of photogravure plates and other types of printing plates which employ etching of metal in their preparation, it is my intention that this application for a letters patent be recognized as fully covering this field of related art as it pertains to the etching of metal even though the subsequent discussion will primarily refer to the field of printed circuitry.

Generally in the manufacture of printed circuits, the starting material is a flat sheet consisting of a binary structure of a highly conductive metal such as copper, and a dielectric sub-structure such as a plastic or ceramic material or a combination of the two. For simplicity of the subsequent discussion, I shall refer to the conducting material as copper, although any other satisfactory electrical conductor such as silver, aluminum, gold, iron or the like, may be employed. The copper is generally adhesively bonded to the non-conductor. It is the usual characteristic of the binary structure that the copper is present in thin sheets, generally of the order of one or two thousandths of an inch in thickness; the thickness of the copper, however, is not a critical consideration in my invention. The copper may be applied in lesser or greater amounts without materially effecting either the use of my apparatus or the application of my process. Also, the copper may be applied to either one or both sides of the dielectric sheet.

To manufacture a printed circuit from the binary structure previously described, the copper is coated with a resist in a prescribed pattern so as to provide a certain path for the flow of electricity to the various components that will subsequently be attached to the printed circuit. If the binary structure is coated with copper on only one side, then the structure is etched on only one side; however, if the structure is coated on both sides with copper, then the structure must be etched on both sides with a preselected different pattern and generally a more complex or compact circuit is produced.

The resist which is employed to define the pattern on the copper is generally applied by one of two methods; (1) the less accurate method used in the production of the more crude circuitry generally employes the silk screen method of resist application; (2) the method of more recent origin and generally applicable to the more critical circuitry is the art of masking by photo-resist. Although other methods may be employed for the application of a resist, such as stenciling, hand painting, pasting, or adhesive bonding; these methods are not generally applicable to mass production methods and, therefore, are not discussed here although the production of the resist image by these methods will generally find application when employing my apparatus and process for etching the areas not protected by resist.

In the practice of the art of silk screening, the copper clad structure is placed in a position immediately beneath the silk screen and a liquid resist is placed on the top side of the silk screen; a doctor blade is then passed over the screen in such a fashion that a portion of the resist passes through preselected pores of the silk screen and deposits the resist on the copper beneath the silk screen form a pattern which is the pattern of the desired printed circuit configuration. The sheet with the image in the liquid state is then removed from beneath the silk screen, dried, and baked to improve the resistance of the resist to the chemical etchant to which the plate is subsequently exposed.

The second major method for application of the resist to the copper, as defined above, is the photo-resist method consisting of coating the copper surface with a resist which is sensitive to light, generally in the actinic range. A photographic negative of the desired printed circuit pattern is then placed in contact with the resist coated copper and the combination is exposed to activating light in much the same manner as contact printing in the field of photography. After sufficient exposure, the light source is removed and the pattern is developed in a solution which dissolves the unexposed resist but leaves the exposed resist forming the pattern on the surface of the copper. The sheet is then baked to improve the chemical resistance of the resist and the structure is then ready for etching.

Numerous methods have been employed for exposure of the resist coated sheets to the etching solution. The first and most obvious method was the immersion of the sheet in a tank containing sufficient liquid etchant to completely cover the sheet; this method was satisfactory for crude designs but the non-uniformity of etch rate due to the variations in temperature at different points in the liquid did not insure quality products so methods of agitation were employed which consisted to either stirring or pumping the solution if the clad sheet were immersed in the liquid; or, as later developed, by application of the chemical etchant to the surface of the sheet from sprays or splashers, rather than immersion. It is quite apparent that it would be difficult to maintain uniformity of etch over the entire surface of the sheet by utilizing any of these methods. If the sheets were flat and immersed in the liquid, the reaction products of the chemical reaction would settle on the surface and actually stop or materially reduce etching in some areas. It should be pointed out that uniformity of etch rate is important to the production of reproducibly accurate circuit boards. This requirement arises from the fact that as the etchant penetrates into the exposed copper surface, the acid tends to undercut the resist in an amount equivalent to the depth of penetration into the surface; therefore, if the etch rate is higher in some areas than in others and this variation cannot be compensated for in the design because of its random character, it is apparent the undercut of the resist in the areas of higher etch rate will be greater than in areas of low etch rate, for the time of exposure to the etching solution will be determinated by the time necessary to remove all the copper in the areas not coated with resist. The greater undercut in the areas of high etch rate, therefore, will actually reduce the width of the copper conductor in the printed circuit. As the resistance of the conductor is directly affected by and inversely proportional to the cross-sectional area and, hence, inversely proportional to the width of the conductor, the greater undercut in the areas of high etch rate will cause increased resistance in the conductor which may ultimately result in failure of the conductor at that point. Therefore, the immersion method of etching was soon abandoned in favor of mechanical methods of application of the etching solution.

The most acceptable methods currently employed are the splash technique and the spray technique. In the splash technique, the sheet is generally mounted horizontally above the solution; the resist coated surface is positioned so that it faces downward but above the tank retaining the etching solution and the paddles. By means of the mechanically rotated paddles, the etching solution is splashed upward so as to hit the resist coated sheet in a random pattern which results in a fair degree of uniformity of etch over the entire surface, provided the etch area is relatively small. The greatest disadvantage of the splash technique is the lack of uniformity of etching over a significant area which has resulted in the limitation of the size of equipment which may be affectively employed in the production of precision parts. Another disadvantage of the splash technique has been a limitation of the application of the etching solution to only one surface at a time; if both surfaces require etching the etching must be completed on one surface before it can be started on the opposite side.

The other method presently employed in the production of precision printed circuit boards, the spray technique, consists simply of pumping the solution through a series of pipes which ultimately discharge through spray heads at various points throughout the etching apparatus so as to provide impingement of the etching solution over the entire surface of the resist coated circuit board. Uniformity of distribution of the etching solution was almost as great a problem with the spray etchers as with the splash technique; however, due to the greater freedom of directional discharge, the pattern of the spray could be easily changed to improve uniformity of distribution but this required extensive experimentation and the results even then were often only short-lived due to nozzle wear and variable line resistance. To reduce or eliminate these variables, the circuit boards were oscillated, rotated in the plane of the board, or passed through the etch zone on a conveyor. Although these improvements were significant, the capacity of the spray etchers were not much greater in relationship to the size of the unit than that of the splash etchers.

In all prior techniques employed in the etching of printed circuit boards, it is to be noted that at all times during the etching cycle, the sheet was exposed, either to the etching solution in the case of the complete immersion, or to the impingement of the solution in the other methods. This long uninterrupted exposure frequently caused failure of the resist, particularly in the instances where high agitation was employed, such as in the spray or splash apparatus.

Another disadvantage of the present manufacturing methods is the inability of the operator to observe the work-piece during the etching operation. In every instance where observation is necessary, it is mandatory that the equipment be stopped and that the work-piece be removed from the etcher in order to examine the extent of the etch and the quality of the operation.

Therefore, it is the object of my invention to provide an etching apparatus for the manufacture of printed circuit boards which will insure greater uniformity of distribution of a spray pattern during the etching operation.

It is a further object of my invention to permit the exposure of a much greater area of work-load in relationship to the relative size of the apparatus as compared to the prior apparatus in the field.

It is still a further object of my invention to provide an apparatus that may be employed for etching circuit boards on one or both sides at the same time; or, if the boards are to be etched on only side, to provide a means of mounting the boards back-to-back so that the large capacity of my apparatus may be fully utilized.

Another object of my invention is to provide an apparatus that will permit observation of the work-piece during the etching cycle without removal of the work-piece from the etcher.

A still further object of my invention is to provide an apparatus whereby the work-piece is exposed to the impingement of the spray during only a portion of the cycle without materially reducing the etch time as compared to the presently employed methods which expose the work piece to the etchant during the entire cycle of the etching operation.

In its simplest concept, the apparatus of my invention consists of a horizontally rotating cyclinder. The opposite ends of the cylinder are mounted on bearings so that the cylinder can be rotated about its major axis. At one end, a drive mechanism is attached to the axle upon which the cylinder is mounted so that as the drive mechanism is activated, the cylinder rotates. A number of sprays attached to fluid lines are mounted both internally and externally to the surface of the cylinder; therefore, as the cylinder is rotated and the spray system is actuated, both the internal skin and the external skins of the cylinder are uniformly covered by the etch solution. In actual practice, the skin of the cylinder is removed and the two ends of the cylinder are held apart by means of rods or bars in such a fashion that as the hypothetical cylinder is rotated, resist-coated printed circuit boards that have been attached to the structural rods or bars previously mentioned would pass through the sprays in much the same manner as the hypothetical cylinder wall. In a complete cycle of the cylinder, the boards would pass through the etch zone, then out of the etch zone for a period of the cycle and then return to the etch zone. Therefore, as each point on the board would rotate through the complete revolution, each point on the surface of the work-piece would drain in all directions which would provide uniformity of etching never before provided. As sprays are mounted both internally and externally to the hypothetical skin of the cylinder, the predesigned, resist-coated surface should be mounted so that the sprays could impinge upon the board from either side, thereby permitting the etching of both sides of the work-piece at once. It will be quite obvious to anyone employing the apparatus of my invention that the number of spray heads and the position of the spray heads would permit the use of sprays that would cover the entire 360° of rotation of the cylinder; however, the method which I prefer is that wherein the resist coated sheet or board is exposed to the spray impingement during only a portion of the cycle of rotation, generally about fifty percent of the cycle or less, and is free from impingement during the remainder of the cycle. The advantages of this type of operation is that during the relatively quiescent period of the cycle where no impingement takes place, the etching continues at a rate comparable to the rate which would result if the work-piece were subjected to the spray impingement during the entire cycle. This unexpected result not only increases the relative capacity of my apparatus but has the additional advantageous result of reducing the chance of mask failure due to impingement by a factor of about fifty percent.

A more precise understanding of my invention will be had by reference to the accompanying drawings in which.

Figures 1, 2, 5:
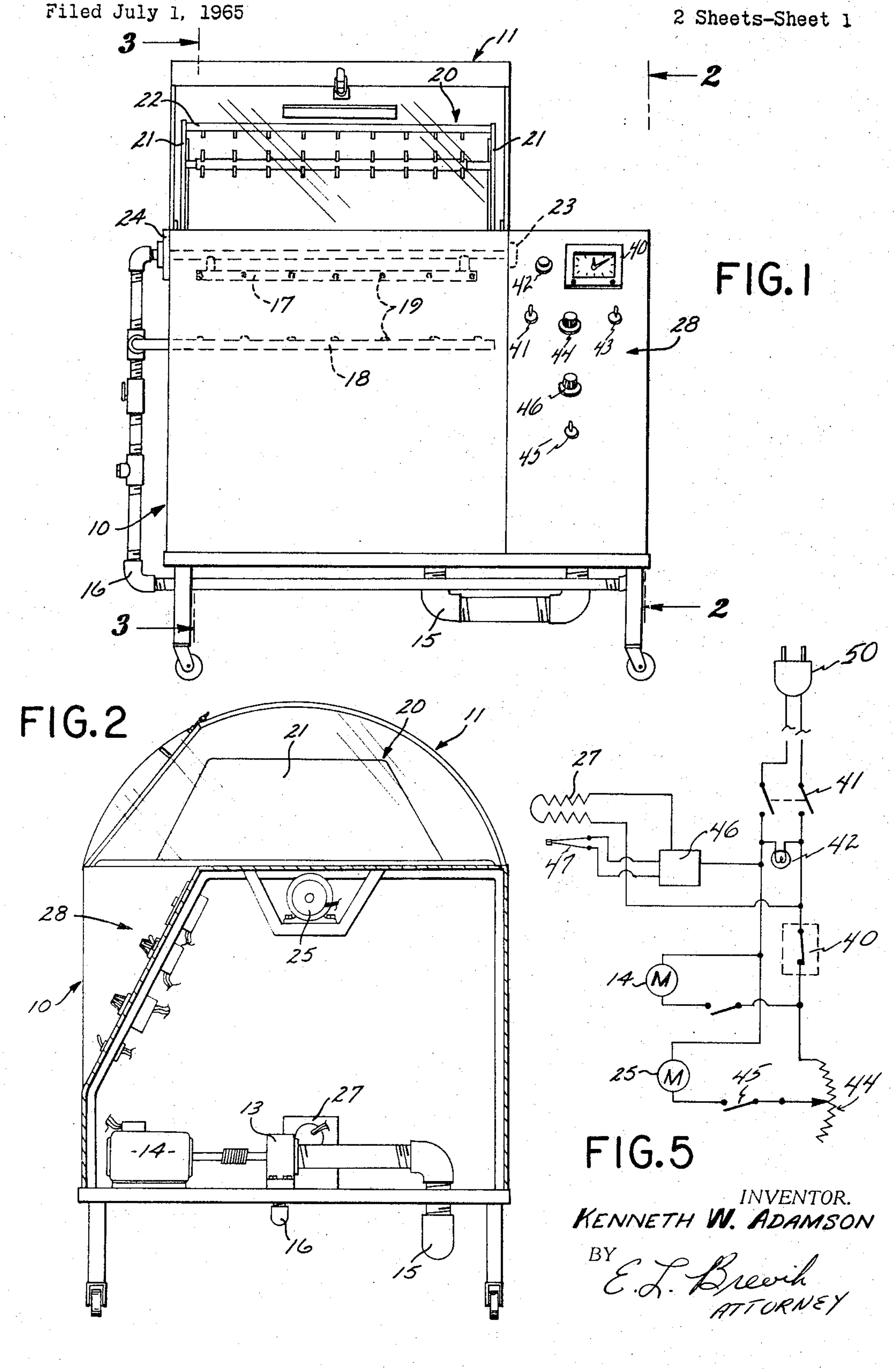
FIG. 1 is a front view of one modification of my invention.
FIG. 2 is a plan view of the right side of the apparatus.
FIG. 5 is a schematic diagram of the electrical circuit of one modification of a simple control assembly.

In FIGS. 1 and 2, numeral 10 represents a corrosion resistant tank assembly which is covered by a transparent cover 11. The tank 10 contains a etching fluid 12. The etching fluid is transported by means of pump 13 which is driven by motor 14. The intake to the pump 13 from tank 10 is by means of line 15; the fluid is discharged from the centrifugal pump 13 through lines 16 and into the inner discharge members 17 and the outer discharge members 18. Internally mounted in the tank assembly 10 is the rotating assembly 20 which, in this instance, instead of being represented as a cylinder, is represented as a prism having hexagonal ends 21 which are held in position by structural members 22. Rotating assembly 20 rests on right hand bearing 23 and left hand bearing 24. The rotating assembly is driven by a direct drive variable speed motor 25. Electrical heater assembly 27 is mounted below the solution level in the tank. The control panel 28 has mounted upon it a lapsed time clock 40 which determines the time during which the rotating assembly 20 and the pump 13 are activated, the master power switch 41 and the power indicator lamp 42, the pump power switch 43, the rotational motor speed rheostat control 44, the rotational motor switch 45, and the heater control 46.

Figure 3:
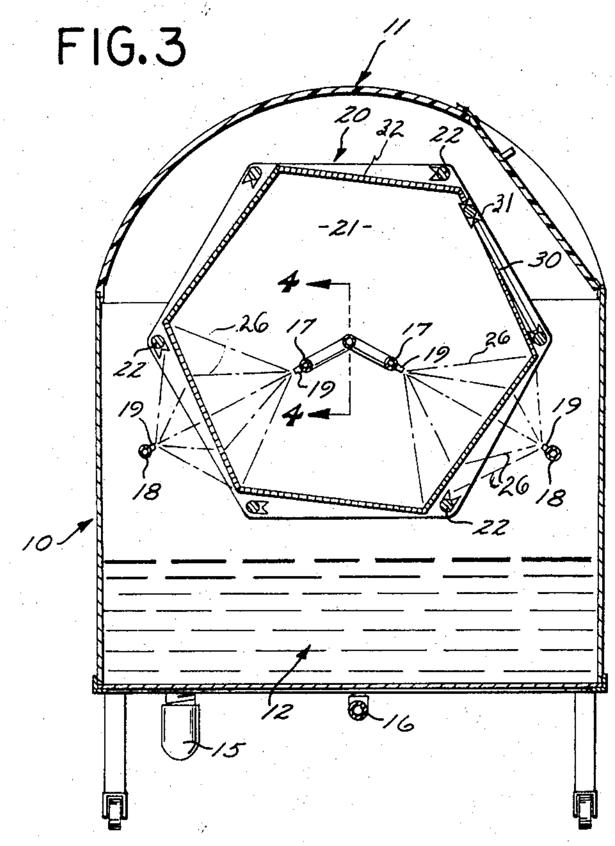
FIG. 3 is a section through 3—3 of FIG. 1.

FIG. 3, the section through 3—3 of FIG. 1, defines the operation of the etcher in detail. Etching fluid 12 contained in tank 10 is pumped from outlet line 15 into discharge line 16 into the inner discharge lines 17 and the other discharge line 18 each of which discharge lines have a number of spray nozzles 19 which form a spray pattern 26. The discharge lines 17 and 18 are so deployed that the discharge from the spray nozzles covers about the same area upon the workpiece which passes between them when mounted upon the rotational assembly 20. As shown, the width of the spray pattern is somewhat less than half of the cycle of rotation. The opposite ends of the rotational assembly 20 are held together by bars or rods 22 to which are attached clips 32 for retaining the work-piece 30 which is further held in place by clip 31 which slides into place along ratchet member 33 which is fastened to the end plates 21. Therefore, as the rotational assembly 20 rotates, the workpiece 30 passes through the spray pattern 26 such that both sides of the work-piece are impinged by the spray. During the etching operation, the work piece can be observed through the transparent cover 11.

Figure 4:
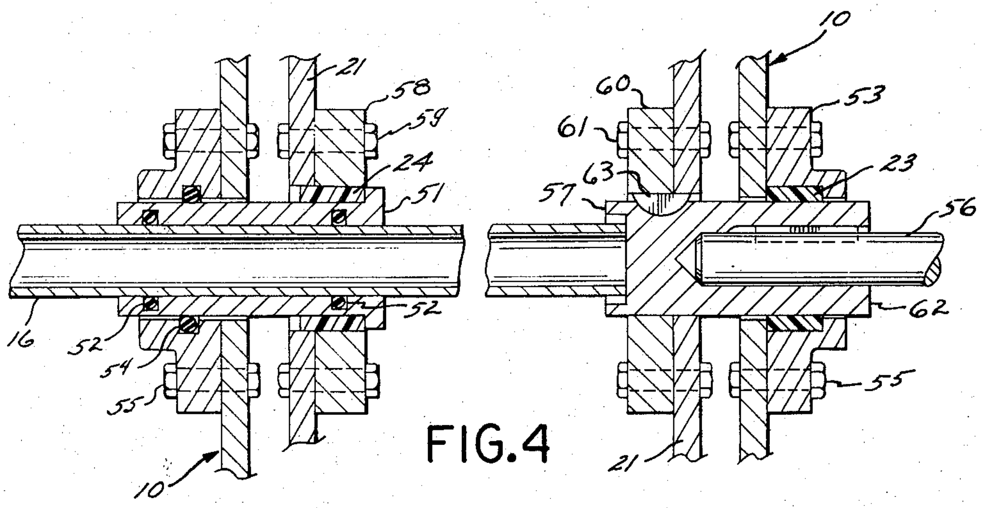
FIG. 4 is a sectional view of 4—4 of FIG. 3 showing the axle and bearing assembly.

FIG. 4 is a section through 4—4 of FIG. 3 showing the end bearing assemblies. The etchant is fed into the system through line 16 to which is attached a sleeve 51 upon which bearing 24 rests; sleeve 51 is attached to line 16 by means of O-rings 52 and is sealed with the tank 10 by means of O-ring 54 which is mounted in exterior reinforcing member 53 which is attached to tank 10 by means of bolts 55. The hexagonal member 21 is reinforced with member 58 which is fastened to member 21 by means of bolts 59. In the left hand assembly, the bearing 24 is attached to members 21 and 58 so that the slippage of the bearing is between bearing 24 and the sleeve 51. In the right hand bearing assembly, the bearing 23 is attached to the external reinforcing member 53 and the bearing slippage takes place between the bearing 23 and the axle 62 which is turned by means of shaft 56 to which it is fixedly attached. The axle 62 is attached to the rotating assembly end plate 21 by means of a key

63 and by internal reinforcing member 60 which is attached to the hexagonal right end plate by means of bolts 61. Line 16 is attached to the right hand assembly by means of rotating joint 57. The unique arrangement of the bearing surfaces which permit the fluid to be sprayed in the area which is inside the hypothetical cylinder of rotation wall is an important characteristic of my invention.

FIG. 5 represents a schematic electrical diagram of the desirable control equipment for the operation of my apparatus. Plug 50 is used for connection to a source of electrical current. The apparatus is activated by means of switch 41 which activates indicator light 42 which is connected in parallel with the heater 27 which is controlled by controller 46 which is activated by thermal switch 47. In one line, timer controller 40 is used to activate pump motor 14 and rotational motor 25 when their respective switches 43 and 45 are closed. Rotational motor 25 has a rheostat speed control 44 for varying the speed of rotation of the rotating assembly 20.

Although I have disclosed one embodiment of my invention, it will be apparent to those skilled in the art that many refinements and modifications may be made which will be within the scope of my invention, the gist of which is the etching of substantialy flat sheets of material from two sides at the same time by means of spraying an etching solution upon the sheet of material by means of mounting the sheet in a rotating assembly in such a manner that as the assembly rotates the sheet is passed through a spray pattern so that it receives an equal and uniform amount of spray upon each of its sides.

Within this concept, I claim the following:

1. An etching apparatus consisting of a spray chamber covered with a transparent cover, a fixture for mounting a workpiece within said chamber, which fixture is capable of rotating about a horizontal axis, spray manifolds having spray heads thereon mounted both internally and externally to the surface of revolution generated by the rotating work-piece which internal and external spray heads are mounted diametrically opposite each other so that the spray impingement pattern covers an arc of less than one hundred and eighty degrees on the bottom of the rotation with no spray in the upper portion of the rotation to permit visual inspection during operation, and which spray pattern is symmetrical about a vertical plane through the horizontal axis, means for circulating the etching fluid through the manifolds and spray heads, and means for rotating the mounting fixture about an axis in the horizontal plane.

2. The etching apparatus of claim 1 in which the liquid is delivered to the internal spray manifold through a pipe mounted in one of the bearings upon which the mounting fixture rotates.

References Cited

UNITED STATES PATENTS

| | | | |
|---|---|---|---|
| 915,898 | 3/1909 | Sochurek | 134—157 X |
| 964,126 | 7/1910 | Smith et al. | 134—153 X |
| 1,042,784 | 10/1912 | Goss | 134—79 |
| 2,951,490 | 9/1960 | Guillier | 134—148 X |
| 3,078,857 | 2/1963 | Guenst | 134—58 X |
| 3,203,437 | 8/1965 | Faust | 134—170 X |

FOREIGN PATENTS

| | | |
|---|---|---|
| 204,292 | 11/1908 | Germany. |
| 275,515 | 10/1964 | Netherlands. |

CHARLES A. WILLMUTH, *Primary Examiner.*

R. L. BLEUTGE, *Assistant Examiner.*